United States Patent [19]

Gabriel

[11] Patent Number: 5,294,295
[45] Date of Patent: Mar. 15, 1994

[54] METHOD FOR MOISTURE SEALING INTEGRATED CIRCUITS USING SILICON NITRIDE SPACER PROTECTION OF OXIDE PASSIVATION EDGES

[75] Inventor: Calvin T. Gabriel, Pacifica, Calif.
[73] Assignee: VLSI Technology, Inc., San Jose, Calif.
[21] Appl. No.: 786,322
[22] Filed: Oct. 31, 1991
[51] Int. Cl.$^5$ .................................................. B44C 1/22
[52] U.S. Cl. ..................................... 156/657; 437/195; 437/203; 437/228; 437/978; 148/DIG. 43
[58] Field of Search ............... 437/190, 195, 228, 235, 437/207, 238, 241, 203, 209, 978; 156/657; 148/DIG. 43

[56] References Cited

U.S. PATENT DOCUMENTS

| | | | |
|---|---|---|---|
| 4,692,786 | 9/1987 | Lindenfelser | 437/238 |
| 4,978,420 | 12/1990 | Bach | 437/203 |
| 5,086,016 | 2/1992 | Brodsky et al. | 437/190 |
| 5,117,273 | 5/1992 | Stark et al. | 437/235 |

FOREIGN PATENT DOCUMENTS

| | | | |
|---|---|---|---|
| 0145628 | 8/1985 | Japan | 437/978 |
| 0115746 | 5/1987 | Japan | 437/978 |
| 0102338 | 5/1988 | Japan | 437/195 |
| 0258043 | 10/1988 | Japan | 437/195 |
| 0069032 | 3/1989 | Japan | 437/195 |
| 0318240 | 12/1989 | Japan | 437/209 |

OTHER PUBLICATIONS

Doo, "Composite Nitride-Oxide Pakaging layer", IBM Tech. Disc. Bul., vol. 13, No. 2, Jul. 1970, pp. 506-507.

Primary Examiner—Brian E. Hearn
Assistant Examiner—Tuan Nguyen
Attorney, Agent, or Firm—Douglas L. Weller

[57] ABSTRACT

For passivation of an integrated circuit device, a film of silicon dioxide is deposited over the integrated circuit device. A film of silicon nitride is deposited over the film of silicon dioxide. The film of silicon nitride and the film of silicon dioxide are etched using a single passivation mask to expose the bond pads of the integrated circuit device. Spacer regions of silicon nitride are placed over edges of the film of silicon dioxide exposed by the etching. The spacer regions may be placed by depositing a second film of silicon nitride over the film of silicon nitride. This second film of silicon nitride covers the metal bond pads and the exposed edges of the film of silicon dioxide. An anisotropic etchback of the second film of silicon nitride is performed to expose the metal bond pads while leaving spacer regions which cover the edges of the film of silicon dioxide.

2 Claims, 3 Drawing Sheets

METHOD FOR MOISTURE SEALING INTEGRATED CIRCUITS USING SILICON NITRIDE SPACER PROTECTION OF OXIDE PASSIVATION EDGES

BACKGROUND

The present invention concerns the protection of integrated circuits by passivation using a silicon nitride spacer to protect oxide passivation edges.

Passivation of integrated circuit devices is commonly performed using a two-layer stack of silicon nitride on silicon dioxide, This protects the integrated circuit devices from scratches during packaging and f rom -moisture which could cause early failure of the integrated circuit.

Oxide films used alone for passivation often do not provide sufficient moisture protection. To prevent moisture penetration, an oxide film and a nitride film are deposited, masked and etched separately on an integrated circuit device. The mask used for the nitride film etch has smaller openings for bond pads of the integrated circuit than the mask that is used for the oxide film etch. This insures that the nitride film completely covers the oxide film everywhere on the integrated circuit device. This also reduces the potential for the nitride film peeling due to stress. However, in this prior art method, the use of two passivation masks has the undesirable result of increasing the level of manufacturing complexity and cost.

SUMMARY OF THE INVENTION

In accordance with the preferred embodiment of the present invention, a method is presented for passivation of an integrated circuit device. In the method, a film of silicon dioxide is deposited over the integrated circuit device. A film of silicon nitride is deposited over the film of silicon dioxide. The film of silicon nitride and the film of silicon dioxide are etched using a single passivation mask to expose the bond pads of the integrated circuit device. Also exposed during this etching are edges of the film of silicon dioxide. Spacer regions of silicon nitride are placed over the exposed edges of the film of silicon dioxide.

The spacer regions are placed, for example, by depositing a second film of silicon nitride over the film of silicon nitride. This second film of silicon nitride also covers the metal bond pads and the exposed edges of the film of silicon dioxide. An anisotropic etchback of the second film of silicon nitride is then performed to expose the metal bond pads while leaving spacer regions which cover the edges of the film of silicon dioxide.

The spacer regions formed as a result of the anisotropic etchback prevent moisture from penetrating the integrated circuit device through the film of silicon dioxide. The presence of the spacer regions also decreases the potential for peeling of the silicon nitride film due to stress. Additionally, the use of a single passivation mask in the method results in a decrease in the level of manufacturing complexity and cost.

DESCRIPTION OF THE PRIOR ART

Figure 1:
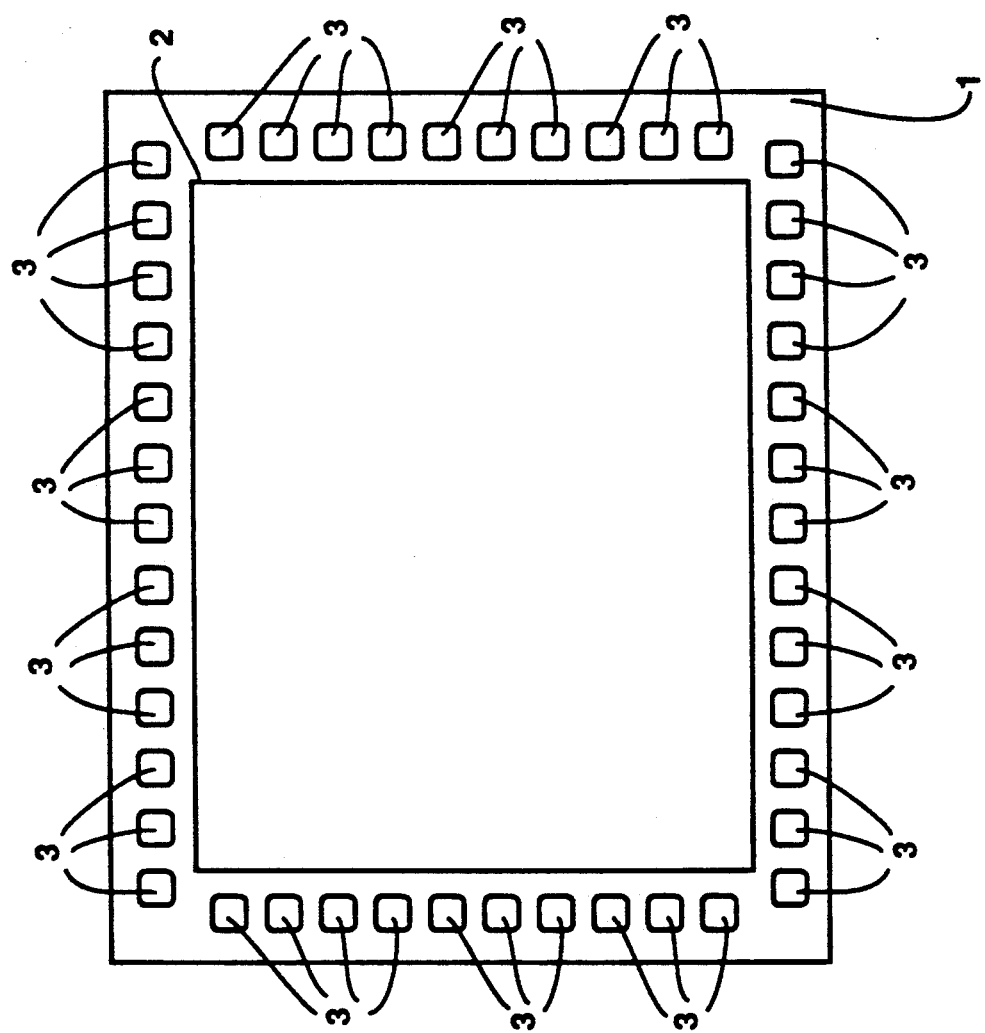
FIG. 1 shows a simplified block diagram of an integrated circuit device.

FIG. 1 shows a very simplified block diagram of an integrated circuit device 1. Integrated circuit device 1 includes logical circuitry 2. Metal bond pads 3 are used as an electrical interface for integrated circuit device 1 to other devices within a computing system. During packaging, wires (not shown) are connected to metal bond pads 3 to provide electrical contact of integrated circuit device 1 with other devices. Passivation over integrated circuit device 1, therefore, must be etched away at metal bond pads 3 to allow for the wires to be electrically connected.

Figure 2:
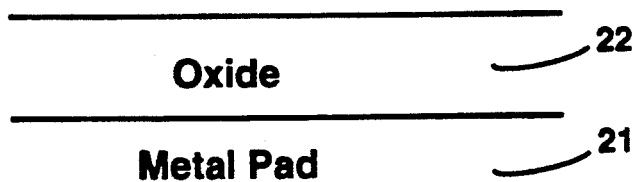
FIG. 2 through FIG. 5 illustrate a prior art method for passivation of an integrated circuit device which uses a separate passivation mask for etching an oxide film and for etching a nitride film.

FIG. 2 through FIG. 5 illustrate a prior art method for passivation of an integrated circuit device. In FIG. 2, a metal bond pad 21 is illustrative of all metal bond pads on an integrated circuit. A film of silicon dioxide 22 is deposited on the integrated circuit device and completely covers metal bond pad 21.

Figure 3:
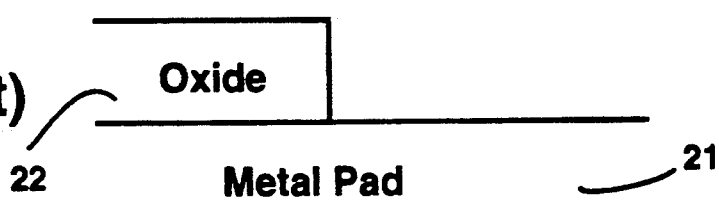
Figure 4:
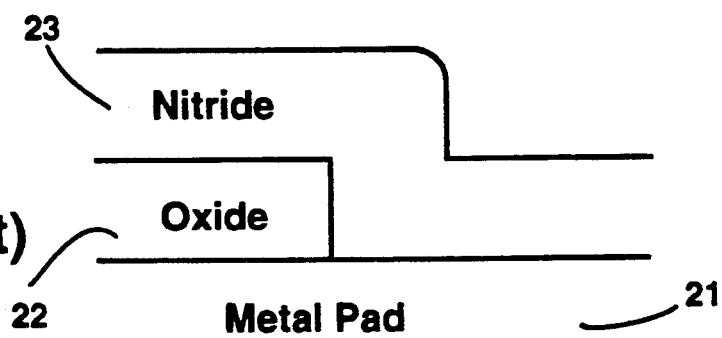

As shown in FIG. 3, silicon dioxide film 22 is etched to expose a portion of metal bond pad 21. As shown in FIG. 4, a film of silicon nitride 23 is deposited on the integrated circuit and covers silicon dioxide film 22 as well as the exposed portions of metal bond pad 21.

Figure 5:
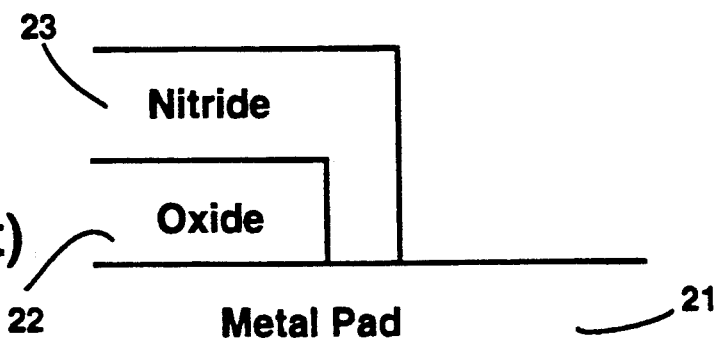

As shown in FIG. 5, silicon nitride film 23 is etched to expose a portion of metal bond pad 21. However, the mask used for the etch of silicon nitride film 23 has a smaller opening for metal bond pad 21 of the integrated circuit than the mask that is used for the etch of silicon dioxide film 22. This insures that silicon nitride film 23 completely covers silicon dioxide film even at the location of metal bond pad 21. If the same mask were used for etching of both silicon nitride film 23 and silicon dioxide film 22, the edge of silicon dioxide film 22 would be exposed at the edge of metal bond pad 21, potentially allowing for moisture to penetrate the passivation layers. This would also increase the potential for peeling of silicon nitride film 23 due to stress. However, as discussed above, the use of separate passivation masks results in an undesirable increase in the level of manufacturing complexity and cost.

DESCRIPTION OF THE PREFERRED EMBODIMENT

Figure 6:
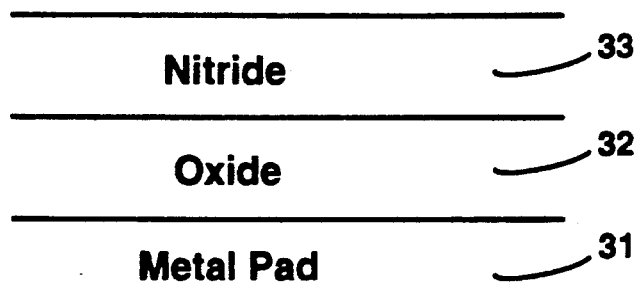
FIG. 6 through FIG. 9 illustrate a method of passivation using a silicon nitride spacer to protect oxide passivation edges in accordance with the preferred embodiment of the present invention.

FIG. 6 through FIG. 9 illustrate a method for passivation of an integrated circuit device in accordance with the preferred embodiment of the present invention. In FIG. 6, a metal bond pad 31 is illustrative of all metal bond pads on an integrated circuit. A film of silicon dioxide 32 is deposited on the integrated circuit device and completely covers metal bond pad 31. For example, silicon dioxide film 32 is 0.5 microns thick. A film of silicon nitride 33 is deposited on the integrated circuit and covers silicon dioxide film 32. For example, silicon nitride film 33 is 1.0 microns thick.

Figure 7:
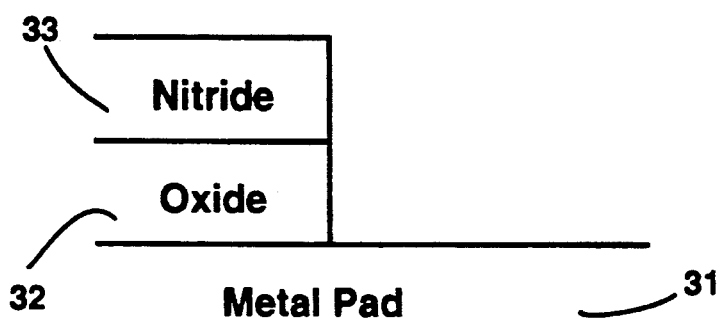

As shown in FIG. 7, silicon dioxide film 32 and silicon nitride film 33 are etched to expose a portion of metal bond pad 31. The etching is performed using the same passivation mask to etch both silicon dioxide film 32 and silicon nitride film 33. As a result of the etch, an edge of silicon dioxide film 32 is exposed, as shown.

Figure 8:
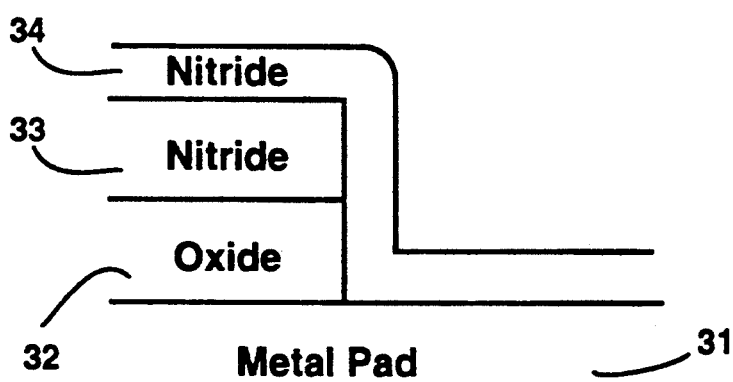
Figure 9:
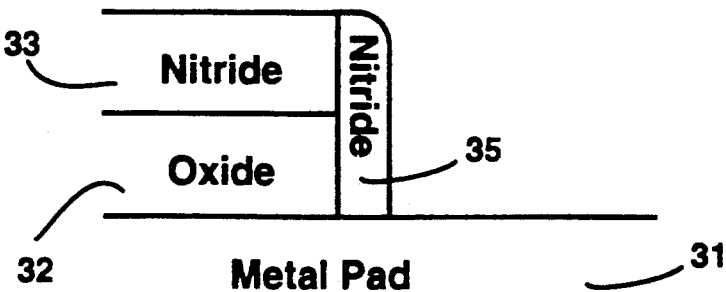

As shown in FIG. 8, a second film of silicon nitride 34 is deposited. Silicon nitride film 34 completely covers silicon nitride film 33 as well as the exposed portions of silicon dioxide film 32 and the exposed portions of metal bond pad 31. For example, silicon nitride film 34 is 0.25 microns thick.

An anisotropic etchback of silicon nitride film 34 is performed so that only a spacer region 35 of silicon nitride film 34 remains. For example, this may be done using a Drytek 384T RF Triode Etcher with a gas flow of SF6 at 15 standard cubic centimeters at 250 Millitorr and at an RF power of 150 Watts. The Drytek 384T RF Triode Etcher is available from General Signal, Drytek, having a business address of 3111 Coronado Drive, Santa Clara, Calif. 95054. For example, spacer region 35 is approximately 0.2 microns thick.

As a result of the anisotropic etchback a portion of metal bond pad 31 is exposed while spacer region 35 covers the edge of silicon oxide film 32. Spacer region 35 thus prevents moisture from penetrating silicon dioxide film 32 and decreases the potential for peeling of silicon nitride film 33 due to stress. Further, the use of a single passivation mask in the process results in a decrease in the level of manufacturing complexity and cost.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for passivation of an integrated circuit device, the method comprising the steps of:
   (a) depositing a film of silicon dioxide over the integrated circuit device;
   (b) depositing a film of silicon nitride over the film of silicon dioxide,
   (c) etching the film of silicon nitride and the film of silicon dioxide using a single passivation mask to expose bond pads of the integrated circuit device; and,
   (d) placing spacer regions of silicon nitride over edges of the film of silicon dioxide exposed by the etching performed in step (c).

2. A method as in claim 1 wherein step (d) includes the substeps of
   (d.1) depositing a second film of silicon nitride over the film of silicon nitride deposited in step (b), over the metal bond pads exposed by the etching performed in step (c), and over the edges of the film of silicon dioxide exposed by the etching performed in step (c); and,
   (d.2) performing an anisotropic etch of the second film of silicon nitride to expose the metal bond pads while leaving spacer regions which cover the edges of the film of silicon dioxide.

* * * * *